(12) United States Patent
Eguchi et al.

(10) Patent No.: US 8,673,749 B2
(45) Date of Patent: Mar. 18, 2014

(54) SEMICONDUCTOR DEVICE MANUFACTURING METHOD

(71) Applicant: DENSO CORPORATION, Aichi-Pref (JP)

(72) Inventors: Kouji Eguchi, Kariya (JP); Youhei Oda, Okazaki (JP); Shinichi Adachi, Obu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/711,993

(22) Filed: Dec. 12, 2012

(65) Prior Publication Data

US 2013/0164913 A1 Jun. 27, 2013

(30) Foreign Application Priority Data

Dec. 26, 2011 (JP) ................................. 2011-282895
May 31, 2012 (JP) ................................. 2012-124953

(51) Int. Cl.
*H01L 21/20* (2006.01)
*H01L 21/36* (2006.01)
*H01L 21/4763* (2006.01)

(52) U.S. Cl.
USPC 438/481; 438/634; 257/E21.09; 257/E21.577

(58) Field of Classification Search
USPC .............. 438/481, 634; 257/E21.09, E21.577
See application file for complete search history.

(56) References Cited

U.S. PATENT DOCUMENTS

| | | | |
|---|---|---|---|
| 5,627,094 A * | 5/1997 | Chan et al. ..................... | 438/253 |
| 2010/0002108 A1 | 1/2010 | Mabuchi | |
| 2013/0143392 A1* | 6/2013 | Romano et al. ............... | 438/478 |

FOREIGN PATENT DOCUMENTS

| | | |
|---|---|---|
| JP | A-9-82667 | 3/1997 |
| JP | A-2003-273051 | 9/2003 |
| JP | A-2006-32846 | 2/2006 |
| JP | A-2007-129115 | 5/2007 |
| JP | A-2009-4442 | 1/2009 |
| JP | A-2010-118536 | 5/2010 |

* cited by examiner

*Primary Examiner* — Michelle Mandala
(74) *Attorney, Agent, or Firm* — Posz Law Group, PLC

(57) ABSTRACT

In a semiconductor device manufacturing method, an insulating layer is formed on a front surface of a semiconductor substrate. Trenches are formed in the substrate by using the insulating layer as a mask so that a first portion of the insulating layer is located on the front surface between the trenches and that a second portion of the insulating layer is located on the front surface at a position other than between the trenches. The entire first portion is removed, and the second portion around an opening of each trench is removed. The trenches are filled with an epitaxial layer by epitaxially growing the epitaxial layer over the front surface side. The front surface side is polished by using the remaining second portion as a polishing stopper.

5 Claims, 9 Drawing Sheets

SEMICONDUCTOR DEVICE MANUFACTURING METHOD

CROSS REFERENCE TO RELATED APPLICATION

This application is based on Japanese Patent Application No. 2011-282895 filed on Dec. 26, 2011 and No. 2012-124953 filed on May 31, 2012, the contents of which are incorporated herein by reference.

TECHNICAL FIELD

The present disclosure relates to a method of manufacturing semiconductor devices, in particular a semiconductor device having a super junction structure, by using an insulating layer on a surface of a semiconductor substrate as a polishing stopper.

BACKGROUND

It is known that a semiconductor device with a super junction structure has a low ON-resistance and a high breakdown voltage. In the super junction structure, a p-type region and a n-type region are formed in a $n^+$-type substrate and alternately arranged in a surface direction of the substrate. JP-A-2010-118536 discloses a method of manufacturing a semiconductor device with such a super junction structure for reducing a variation in the breakdown voltage.

The method disclosed in JP-A-2010-118536 is as follows. Firstly, a semiconductor substrate (i.e., semiconductor wafer) is prepared. The semiconductor substrate includes a $n^+$-type substrate and a $n^-$-type semiconductor layer epitaxially grown on the substrate. The semiconductor substrate has multiple chip regions partitioned along a scribe line. Then, a first oxide layer as an insulating layer is formed on a main surface of the semiconductor substrate. Next, patterning of the first oxide layer is performed so that the first oxide layer can be left only on the scribe line. Then, a second oxide layer as an insulating layer is formed on the main surface of the semiconductor substrate so that the first oxide layer on the scribe line can be covered with the second oxide layer. Thus, the thickness of the oxide layer (i.e., total thickness of the first oxide layer and the second oxide layer) on the main surface of the semiconductor substrate is largest on the scribe line.

Next, patterning of the second oxide layer is performed. Then, trenches are formed in the semiconductor substrate in a stripe pattern by using the second oxide layer as a mask. Then, wet etching is performed by using hydrofluoric acid so that the second oxide layer can be removed without removing the first oxide layer. As a result, the oxide layer (i.e., the first oxide layer) is left on only the scribe line. If the oxide layer is left near an opening of the trench, it is difficult to fill the trench with an epitaxial layer in a later process, and also it is likely that a defect occurs in the epitaxial layer.

Then, a p-type epitaxial layer is epitaxially grown over the main surface side of the semiconductor substrate so that the trenches can be filled with the epitaxial layer. As a result, a p-type region (i.e., epitaxial layer in the trench) and a n-type region (i.e., portion of the semiconductor substrate sandwiched between adjacent trenches) are alternately arranged in a surface direction of the semiconductor substrate. Thus, a super junction structure is formed.

Then, the epitaxial layer on the main surface side of the semiconductor substrate is polished and planarized by chemical mechanical polishing (CME) or the like. In this planarization process, the first oxide layer is used as a polishing stopper to reduce inclination of the polished surface with respect to the main surface of the semiconductor substrate. Thus, the distance from the polished surface to the bottom of the trench (i.e., the thickness of the epitaxial layer) can be uniform. Therefore, when the semiconductor substrate is divided along the scribe line into chips in a later process, each chip (i.e., each semiconductor device) can have almost the same breakdown voltage.

Then, after the first oxide layer and the epitaxial layer on the main surface are removed by using hydrofluoric add, a predetermined thickness of the main surface is polished away. Then, a p-type epitaxial layer is formed again on the main surface of the semiconductor substrate. Then, a standard semiconductor manufacturing process is applied to each chip region. Finally, the semiconductor substrate is divided along the scribe line into the chips. In this way, the semiconductor device with the super junction structure is manufactured.

In the conventional manufacturing method described above, the first oxide layer used as a polishing stopper in the planarization process and the second oxide layer used as a mask for forming the trench are formed in different manufacturing processes.

SUMMARY

In view of the above, it is an object of the present disclosure to provide a method of manufacturing a semiconductor device without performing a manufacturing process where only a polishing stopper is formed.

According to an aspect of the present disclosure, a method of manufacturing a semiconductor device includes preparing a semiconductor substrate having a front surface, forming an electrically insulating layer on the front surface, and forming trenches in the semiconductor substrate by using the insulating layer as a mask so that a first portion of the insulating layer is located on the front surface between the trenches and that a second portion of the insulating layer is located on the front surface at a position other than between the trenches. The method further includes removing the entire first portion and removing the second portion around an opening of each trench. The method further includes filling the plurality of trenches with an epitaxial layer by epitaxially growing the epitaxial layer over the front surface side. The method further includes planarizing the front surface side by polishing the epitaxial layer 9 using the second portion as a polishing stopper.

BRIEF DESCRIPTION OF THE DRAWINGS

The above and other objects, features, and advantages will become more apparent from the following description and drawings in which like reference numerals depict like elements. In the drawings.

DETAILED DESCRIPTION

First Embodiment

A first embodiment of the present disclosure is described below with reference to the drawings. According to the first embodiment, a semiconductor device with a super junction structure is manufactured. In the super junction structure, a n-type region and a p-type region are formed on a n$^+$-type substrate and alternately arranged in a surface direction of the substrate. FIGS. 1A-1H and FIGS. 2A-2H are diagrams illustrating processes of manufacturing the semiconductor device. Specifically, FIGS. 1A, 1C, 1E, 1G, 2A, 2C, 2E, and 2G are cross sectional views of the semiconductor device in first to eighth manufacturing processes, respectively. FIGS. 1B, 1D, 1F, 1H, 2B, 2D, 2F, and 2H are top views of the semiconductor device in the first to the eighth manufacturing processes, respectively. It is noted that an oxide layer in each top view is hatched for easy understanding.

Figure 1A:
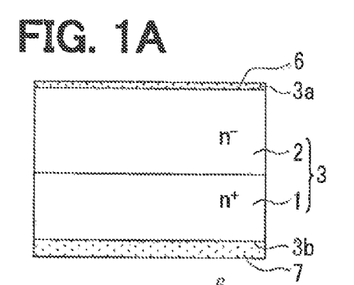
FIGS. 1A-1H are diagrams illustrating processes of manufacturing a semiconductor device according to a first embodiment of the present disclosure.
Figure 1B:
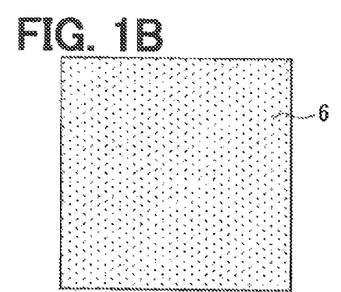

In the first manufacturing process shown in FIGS. 1A and 1B, a semiconductor substrate (i.e., semiconductor wafer) 3 is prepared. The semiconductor substrate 3 includes a n$^+$-type substrate 1 and a n$^-$-type semiconductor layer 2 that is epitaxially grown on the substrate 1. As shown in FIG. 3, the semiconductor substrate 3 has chip regions 5 partitioned by a scribe line 4. In FIGS. 1A-1H and FIGS. 2A-2H, only one chip region 5 of the semiconductor substrate 3 is illustrated.

Then, an oxide layer 6 (i.e., electrically insulating layer) is formed on a front surface 3a of the semiconductor substrate 3. For example, the oxide layer 6 can be formed by thermal oxidation, such as wet oxidation or dry oxidation, or by chemical vacuum deposition (CVD). After the CVD is performed, thermal treatment can be performed to harden the oxide layer 6. For example, in the first manufacturing process, the oxide layer 6 can be formed to a thickness of 200 nm. Further, an oxide layer 7 is formed on a back surface 3b of the semiconductor substrate 3. The back surface 3b is opposite to the front surface 3a. The oxide layer 7 serves to reduce out diffusion.

The front surface 3a of the semiconductor substrate 3 is a surface of the semiconductor layer 2 on the far side from the substrate 1. The back surface 3b of the semiconductor substrate 3 is a surface of the substrate 1 on the far side from the semiconductor layer 2. It is not always necessary that the thickness of the oxide layer 6 on the front surface 3a of the semiconductor substrate 3 is uniform. For example, the oxide layer 6 can be thinner at a position between trenches 8, which are formed in a later process, than at any other position on the front surface 3a of the semiconductor substrate 3.

Figure 1C:
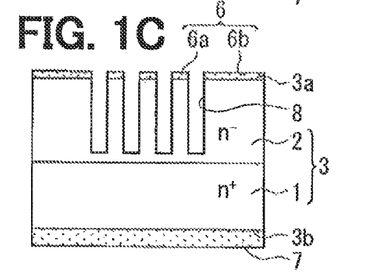
Figure 1D:
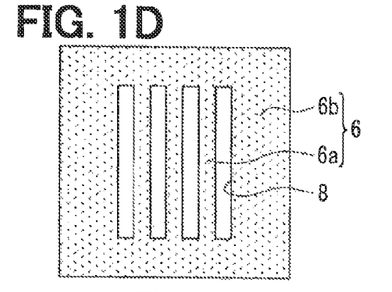

Next, in the second manufacturing process shown in FIGS. 1C and 1D, patterning of the oxide layer 6 is performed so that the oxide layer 6 can have openings at positions corresponding to the trenches 8, which are formed in the later process. Then, anisotropic etching, such as reactive ion etching (RIE), of the semiconductor layer 2 is performed by using the patterned oxide layer 6 as an etching mask. As a result of the anisotropic etching, the trenches 8 are formed in the semiconductor layer 2. The trenches 8 extend in a predetermined direction and are arranged in a stripe pattern.

Figure 1E:
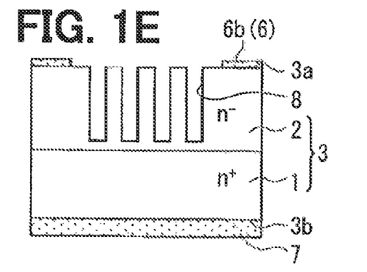
Figure 1F:
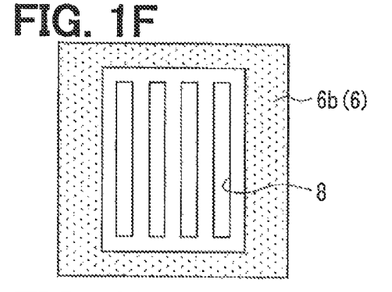
Figure 3:
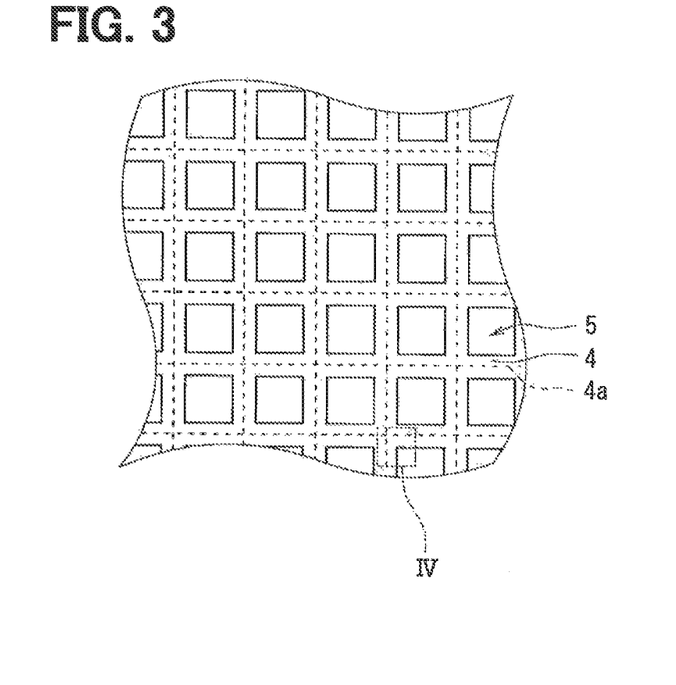
FIG. 3 is a diagram illustrating a partial plan view of a semiconductor substrate used to manufacture the semiconductor device.
Figure 4:
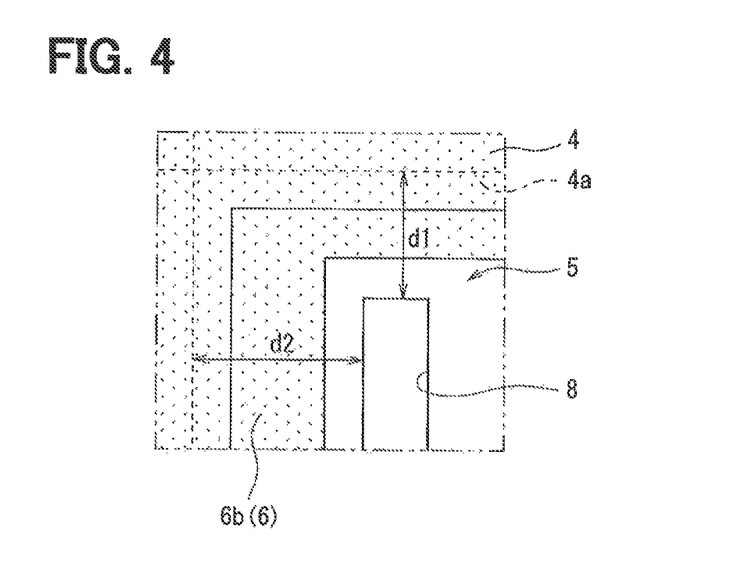
FIG. 4 is a diagram illustrating an enlarged view of an area IV in FIG. 3.

For example, a separation distance between adjacent trenches 8 on the front surface 3a of the semiconductor substrate 3 can be four micrometers (i.e., 4 μm). FIG. 4 is an enlarged view of an area IV in FIG. 3 and shows a state after the third manufacturing process shown in FIGS. 1E and 1F is completed. As shown in FIG. 4, a first distance d1 is a distance between a center line 4a of the scribe line 4 and the trench 8 in a longitudinal direction of the trench 8, and a second distance d2 is a distance between the center line 4a and the trench 8 in a width direction of the trench 8. For example, each of the first distance d1 and the second distance d2 can range from tens to hundreds micrometers (μm). Further, according to the first embodiment, a bottom of the trench 8 is located in the semiconductor layer 2. In other words, the trench 8 does not reach the substrate 1.

The oxide layer 6 located between the trenches 8 on the front surface 3a of the semiconductor substrate 3 is hereafter sometimes referred to as the "first portion 6a" of the oxide layer 6. The oxide layer 6 located at a position other than between the trenches 8 on the front surface 3a of the semiconductor substrate 3 is hereafter sometimes referred to as the "second portion 6b" of the oxide layer 6.

Next, in the third manufacturing process shown in FIGS. 1E and 1F, the oxide layer 6 located near an opening of the trench 8 is removed. Specifically, the first portion 6a is entirely removed, and the second portion 6b is partially removed so that the second portion 6b can be left on an outer edge of the chip region 5. In other words, the second portion 6b around the opening of each trench 8 is removed. Thus, the openings of the trenches 8 can be spaced the second portion 6b and surrounded by the second portion 6b.

As shown in FIG. 4, the second portion 6b is left not only on the outer edge of the chip region 5 but also on the scribe line 4.

Figure 5:
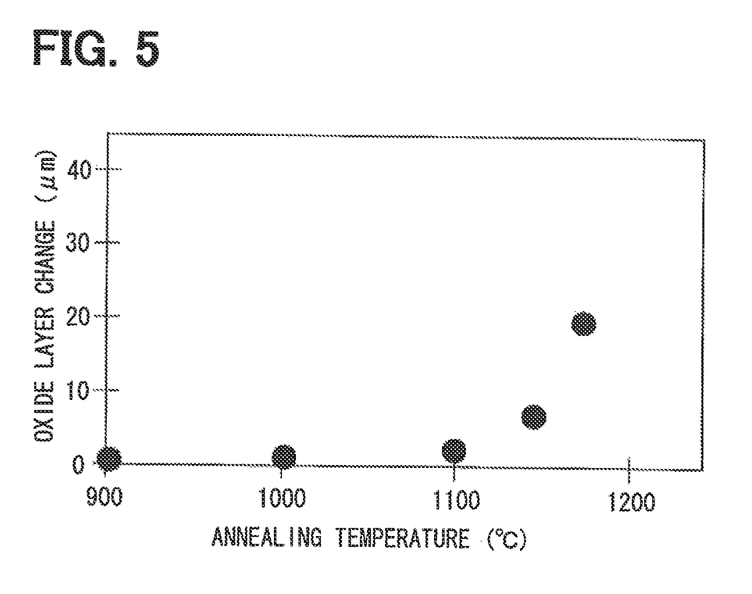
FIG. 5 is a diagram illustrating a relationship between a hydrogen annealing temperature and an oxide layer change.
Figure 6:
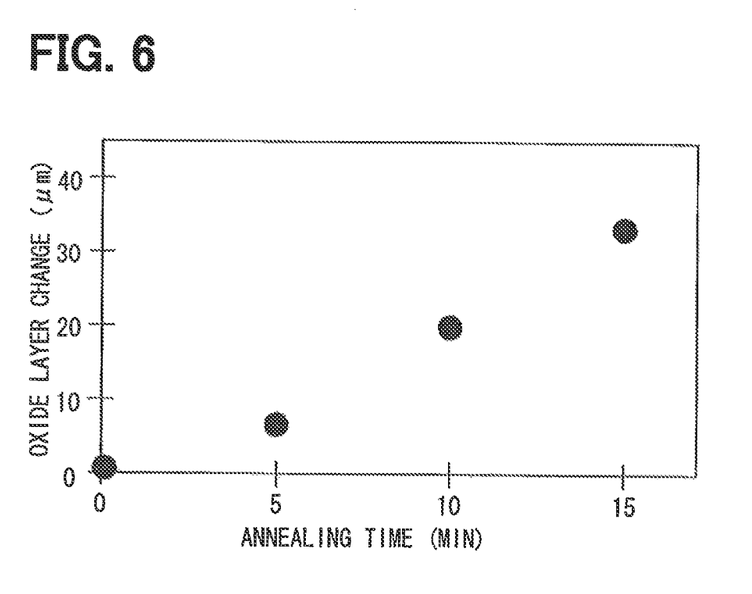
FIG. 6 is a diagram illustrating a relationship between a hydrogen annealing time and an oxide layer change.

Specifically, in the third manufacturing process shown in FIGS. 1E and 1F, the oxide layer 6 located near the opening of the trench 8 is removed by performing annealing under a non-reducing atmosphere. For example, hydrogen annealing is performed. FIG. 5 shows a relationship between a hydrogen annealing temperature and an oxide layer change. FIG. 6 shows a relationship between a hydrogen annealing time and the oxide layer change. In FIGS. 5 and 6, the oxide layer change represents a reduction of the length of the oxide layer 6 in a direction parallel to the front surface 3a of the semiconductor substrate 3. The relationships shown in FIGS. 5 and 6 are based on the premise that the thickness of the oxide layer 6 is 200 nm and the hydrogen annealing is performed at a pressure of 80 Torr. The relationship shown in FIG. 5 is based on the premise that the hydrogen annealing time is ten minutes (i.e., 10 min). The relationship shown in FIG. 6 is based on the premise that the hydrogen annealing temperature is 1170° C.

As can be seen from FIG. 5, the oxide layer change increases with an increase in the hydrogen annealing temperature. Further, as can be seen from FIG. 6, the oxide layer change increases with an increase in the hydrogen annealing time.

As mentioned previously, according to the first embodiment, the separation distance between the trenches 8 on the front surface 3a of the semiconductor substrate 3 is 4 μm. In this case, for example, by performing the hydrogen annealing at the hydrogen annealing temperature of 1100° C. for the hydrogen annealing time of 10 minutes, the first portion 6a can be entirely removed while removing the second portion 6b around the opening of the trench 8. Alternatively, by performing the hydrogen annealing at the hydrogen annealing temperature of 1170° C. for the hydrogen annealing time of 2 minutes, the first portion 6a can be entirely removed while removing the second portion 6b around the opening of the trench 8. In this way, by suitably adjusting the hydrogen annealing temperature and the hydrogen annealing time, the oxide layer 6 located near the opening of the trench 8 can be removed while leaving the oxide layer 6 on the outer edge of the chip region 5.

Figure 7:
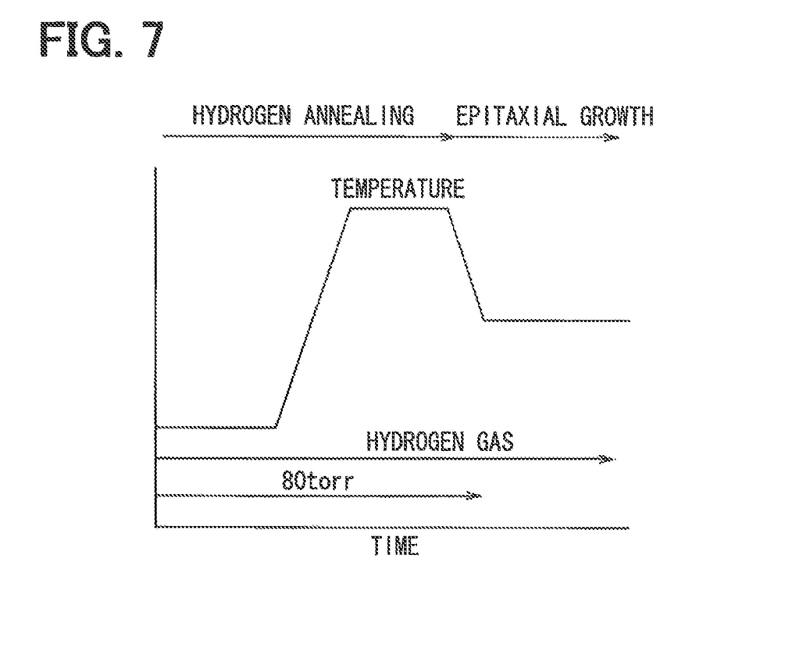
FIG. 7 is a state diagram during hydrogen annealing and epitaxial growth.

FIG. 7 is a state diagram during the hydrogen annealing and epitaxial growth, which is described later. As shown in FIG. 7, when the hydrogen annealing is performed, only hydrogen is introduced. To reduce a defect in a side wall of the trench 8, it is preferable that the hydrogen annealing be performed at a pressure of 80 torr or less.

Figure 1G:
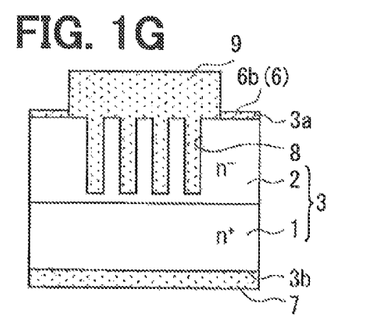
Figure 1H:
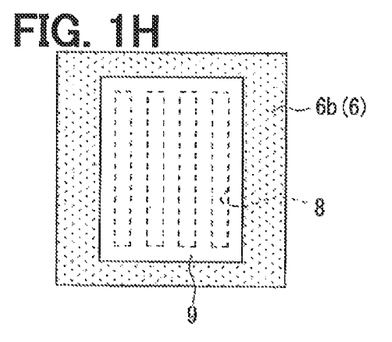

Next, in the fourth manufacturing process shown in FIGS. 1G and 1H, a p-type epitaxial layer 9 is grown over the front surface 3a side of the semiconductor substrate 3 so that each trench 8 can be filled with the epitaxial layer 9. According to the first embodiment, the epitaxial layer 9 is grown until the trench 8 is entirely filled with the epitaxial layer 9 and the epitaxial layer 9 on the front surface 3a of the semiconductor substrate 3 can have a thickness of from about 1 μm to about 10 μm.

For example, as disclosed in Japanese Patent Application No. 2004-352010 filed by the present inventors, a mixed gas of a silicon source gas and a halide gas can be supplied to the semiconductor substrate 3 to grow the epitaxial layer 9. For example, the silicon source gas can be silane (SiH4), disilane (Si2H6), dichlorosilane (SiH2Cl2), trichlorosilane (SiHCl3), or silicon tetrachloride (SiCl4). In particular, dichlorosilane, trichlorosilane, or silicon tetrachloride be preferable for the silicon source gas. For example, the halide gas can be hydrogen chloride (HCl), chlorine (Cl2), fluorine (F2), chlorine trifluoride (ClF3), hydrogen fluoride (HF), or hydrogen bromide (HBr).

It is preferable that the growth of the epitaxial layer 9 be performed under reaction control. In particular, when silane or disilane is used as the silicon source gas, it is preferable that the growth of the epitaxial layer 9 be performed at a temperature of 950° C. or less. When dichlorosilane is used as the silicon source gas, it is preferable that the growth of the epitaxial layer 9 be performed at a temperature of 1100° C. or less. When trichlorosilane is used as the silicon source gas, it is preferable that the growth of the epitaxial layer 9 be performed at a temperature of 1150° C. or less. When silicon tetrachloride is used as the silicon source gas, it is preferable that the growth of the epitaxial layer 9 be performed at a temperature of 1200° C. or less.

When the growth of the epitaxial layer 9 is performed at a vacuum of from normal to 100 Pa, it is preferable that the growth of the epitaxial layer 9 be performed at a temperature of 800° C. or more. When the growth of the epitaxial layer 9 is performed at a vacuum of from 100 Pa to $1\times10^{-5}$ Pa, it is preferable that the growth of the epitaxial layer 9 be performed at a temperature of 600° C. or more.

By performing the growth of the epitaxial layer 9 under the above described conditions, the trench 8 can be surely filled with the epitaxial layer 9. Further, since the mixed gas containing halide gas is used for the growth of the epitaxial layer 9, it is less likely that the epitaxial layer 9 is grown on the oxide layer 6. That is, the growth of the epitaxial layer 9 can be selectively performed. Thus, it is possible to prevent the epitaxial layer 9 having a defect from being formed on the oxide layer 6.

Figure 2A:
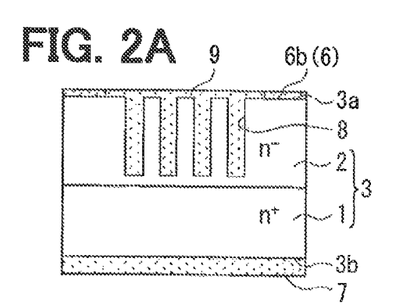
FIGS. 2A-2H are diagrams illustrating processes subsequent to the processes of FIGS. 1A-1H.
Figure 2B:
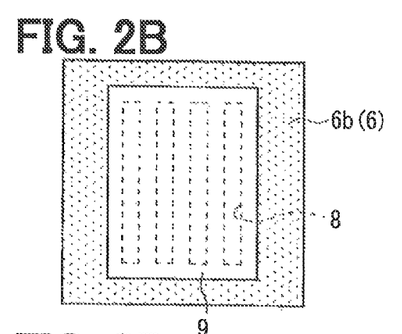

Next, in the fifth manufacturing process shown in FIGS. 2A and 2B, the front surface 3a side of the semiconductor substrate 3 is planarized by polishing the epitaxial layer 9 by chemical mechanical planarization (CMP) or the like. A polishing solution (i.e., slurry) having a polishing selectivity of from about fifty to about two hundreds can be used in the fifth manufacturing process. The polishing selectivity is a ratio of a first rate, at which the semiconductor substrate 3 is polished, to a second rate, at which the oxide layer 6 is polished. For example, the polishing solution can be P1000.

The planarization of the front surface 3a side is continued until the epitaxial layer 9 becomes flush with the second portion 6b. That is, the second portion 6b is used as a polishing stopper for stopping the planarization of the front surface 3a side.

In such an approach, an inclination of the polished surface with respect to the front surface 3a of the semiconductor substrate 3 is reduced or prevented. Thus, a variation in the distance from the polished surface to the bottom of the trench 8 (i.e., the thickness of the epitaxial layer 9) in each chip region 5 can be reduced or prevented.

The present inventors have conducted an experiment to determine whether the oxide layer 6 can serve as the polishing stopper for the planarization when the planarization is performed at a chamber pressure of from 300 hPa to 600 hPa for a polishing time of from 150 seconds to 400 seconds. The result of the experiment indicates that when the oxide layer 6 has the thickness of at least 50 nm before the planarization, the oxide layer 6 can serve as the polishing stopper for the planarization. Based on this result, according to the first embodiment, the oxide layer 6 having the thickness of 200 nm is formed on the front surface 3a of the semiconductor substrate 3 in the first manufacturing process shown in FIGS. 1A and 1B.

It is noted that when the hydrogen annealing is performed in the third manufacturing process shown in FIGS. 1E and 1F, the oxide layer 6 is removed not only in the direction parallel to the front surface 3a of the semiconductor substrate 3 but also in a direction perpendicular to the front surface 3a of the semiconductor substrate 3 (i.e., in a thickness direction of the oxide layer 6). The present inventors have conducted another experiment and have found out that the oxide layer change due to the hydrogen annealing (i.e., the reduction in the length of the oxide layer 6 due to the hydrogen annealing) is much smaller in the thickness direction of the oxide layer 6 than in the direction parallel to the front surface 3a of the semiconductor substrate 3. For example, according to the result of the other experiment, when the hydrogen annealing is performed in such a manner that the length of the oxide layer 6 in the direction parallel to the front surface 3a of the semiconductor substrate 3 is reduced by about 20 μm, the length of the oxide layer 6 in the thickness direction of the oxide layer 6 is reduced by about 0.025 μm. For the above reasons, when the oxide layer 6 has the thickness of 200 nm before the planarization, it is ensured that the oxide layer 6 can serve as the polishing stopper for the planarization.

Figure 2C:
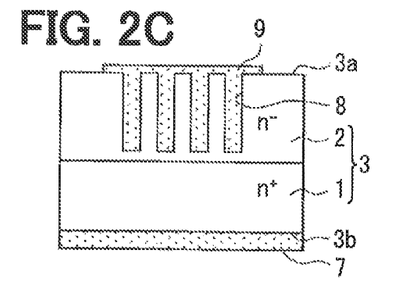
Figure 2D:
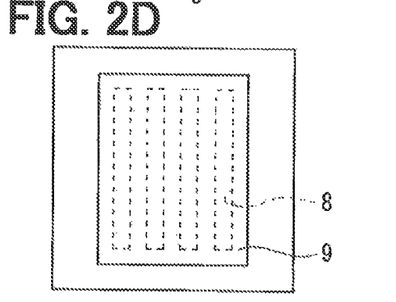

Next, in the sixth manufacturing process shown in FIGS. 2C and 2D, the second portion 6b left on the front surface 3a of the semiconductor substrate 3 is removed by using hydrofluoric acid or the like.

Figure 2E:
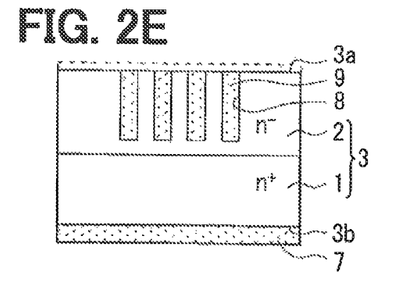
Figure 2F:
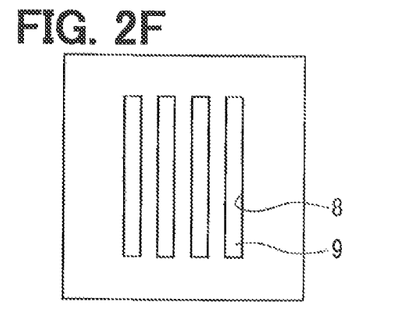

Next, in the seventh manufacturing process shown in FIGS. 2E and 2F, the front surface 3a side of the semiconductor substrate 3 is planarized again so that the epitaxial layer 9 left on the front surface 3a of the semiconductor substrate 3 can be entirely removed and that a predetermined amount of the front surface 3a of the semiconductor substrate 3 can be polished away. For example, in the seventh manufacturing process, the amount of from about 1 μm to 2 μm of the front surface 3a can be polished away so that the thickness of the semiconductor layer 2 can be reduced by about 1 μm to 2 μm. A reason for removing the front surface 3a of the semiconductor substrate 3 by the predetermined amount is that a defect in the epitaxial layer 9 in the trench 8 is likely to occur near the opening of the trench 8. As a result of the seventh manufacturing process, a super junction structure having a p-type region (i.e., the epitaxial layer 9 in the trench 8) and a n-type region (i.e., the semiconductor layer 2 between the trenches 8) is formed in the semiconductor substrate 3.

As mentioned previously, after the fifth manufacturing process shown in FIGS. 2A and 2B is finished, the inclination of the polished surface with respect to the front surface 3a of the semiconductor substrate 3 is reduced or prevented. Accordingly, after the seventh manufacturing process shown in FIGS. 2E and 2D is finished, the inclination of the polished surface with respect to the front surface 3a of the semiconductor substrate 3 is reduced or prevented.

Figure 2G:
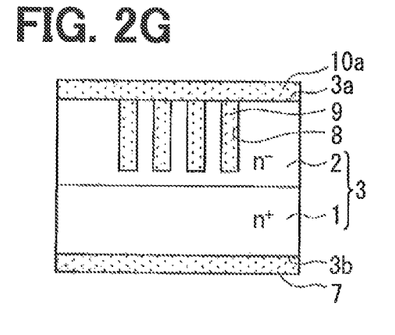
Figure 2H:
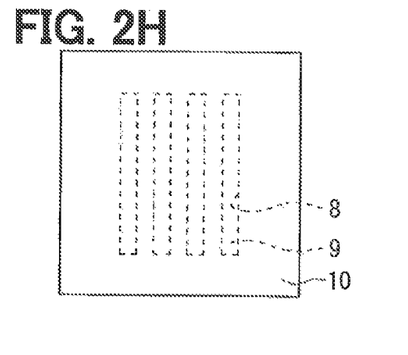

Next, in the eighth manufacturing process shown in FIGS. 2G and 2H, a p-type epitaxial layer 10 is formed on the front surface 3a of the semiconductor substrate 3. Although not shown in the drawings, standard semiconductor manufacturing processes are performed subsequent to the eighth manufacturing process. Then, the semiconductor substrate 3 is divided along the scribe line 4 into chips (i.e., semiconductor devices). Thus, the semiconductor device with the super junction structure can be manufactured. For example, the semiconductor device can be a trench gate MOSFET or a planar gate MOSFET.

It is noted that $n^+$-type and $n^-$-type in the first embodiment correspond to a first conductivity type in claims, and p-type corresponds to a second conductivity type in claims.

As described above, according to the first embodiment, the oxide layer 6 (i.e., second portion 6b) is used as the polishing stopper for the planarization performed in the fifth manufacturing process shown in FIGS. 2A and 2B. In such an approach, after the fifth manufacturing process shown in FIGS. 2A and 2B is finished, the incitation of the polished surface with respect to the front surface 3a of the semiconductor substrate 3 is reduced or prevented. Thus, the variation in the distance from the polished surface to the bottom of the trench 8 (i.e., the thickness of the epitaxial layer 9) in each chip region 5 can be reduced or prevented.

Accordingly, after the seventh manufacturing process shown in FIGS. 2E and 2F is finished, the incitation of the polished surface with respect to the front surface 3a of the semiconductor substrate 3 is reduced or prevented so that the distance.

Figure 8:
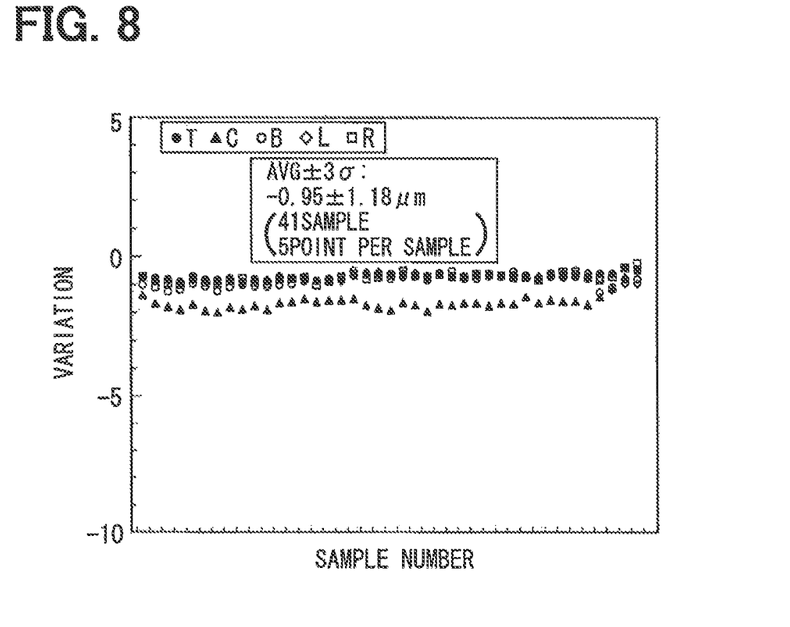
FIG. 8 is a diagram illustrating a result of a first evaluation experiment to evaluate a variation in a polished amount of a semiconductor substrate manufactured by a method that uses an oxide layer as a polishing stopper.

The present inventors have conducted a first evaluation experiment to evaluate a variation in the polished amount of the front surface 3a of the semiconductor substrate 3 of the semiconductor device manufactured by the method according to the first embodiment (i.e., manufactured by using the oxide layer 6 as the polishing stopper). FIG. 8 shows a result of the first evaluation experiment. In the first evaluation experiment, the variation is represented as the average (i.e., the mean) plus or minus three standard deviations (i.e., $3\sigma$). In the first experiment, shown in FIG. 10, the polished amount is measured at five points C, T, B, L, R on the semiconductor substrate 3 after performing the seventh manufacturing process shown in FIGS. 2E and 2F in such a manner that the polished amount becomes 1.8 μm at the center point C. In the first evaluation experiment, forty-one semiconductor substrates 3 as samples are evaluated.

Figure 9:
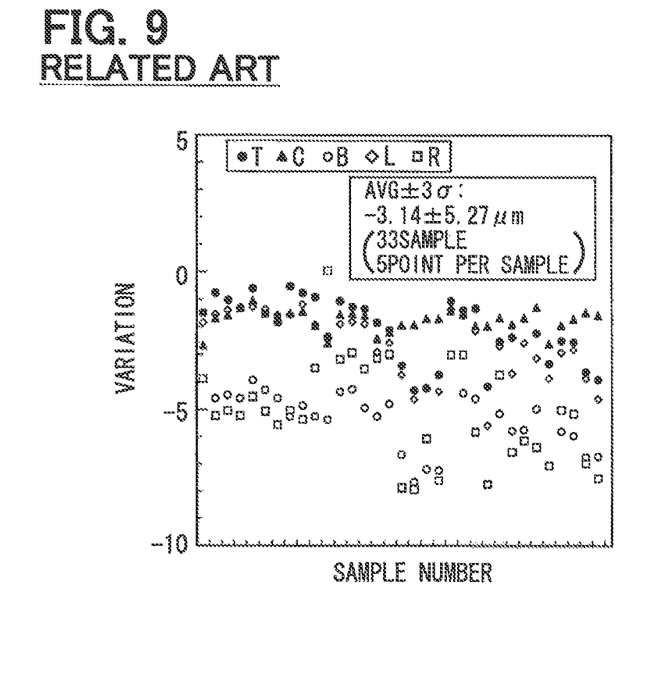
FIG. 9 is a diagram illustrating a result of a second evaluation experiment to evaluate a variation in a polished amount of a semiconductor substrate manufactured by a method that does not use an oxide layer as a polishing stopper.
Figure 10:
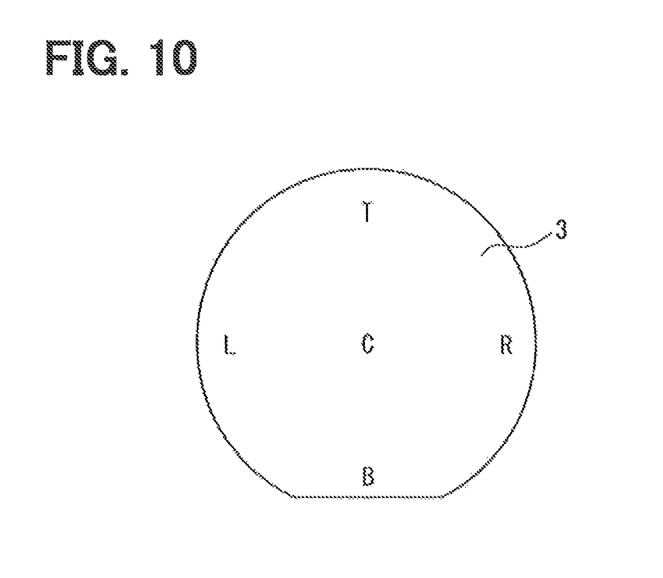
FIG. 10 is a diagram illustrating points on the semiconductor substrate at which the variation in the polished amount is evaluated.

Likewise, the present inventors have conducted a second evaluation experiment to evaluate a variation in the polished amount of the front surface 3a of the semiconductor substrate 3 of the semiconductor device manufactured by a method that does not use the oxide layer 6 as the polishing stopper. FIG. 9 shows a result of the second evaluation experiment. In the second experiment, as shown in FIG. 10, the polished amount is measured at the five points C, T, B, L, R on the semiconductor substrate 3 after performing the seventh manufacturing process shown in FIGS. 2E and 2F in such a manner that the polished amount becomes 1.8 μm at the center point C. In the second evaluation experiment, thirty-three semiconductor substrates 3 as samples are evaluated.

Figure 11:
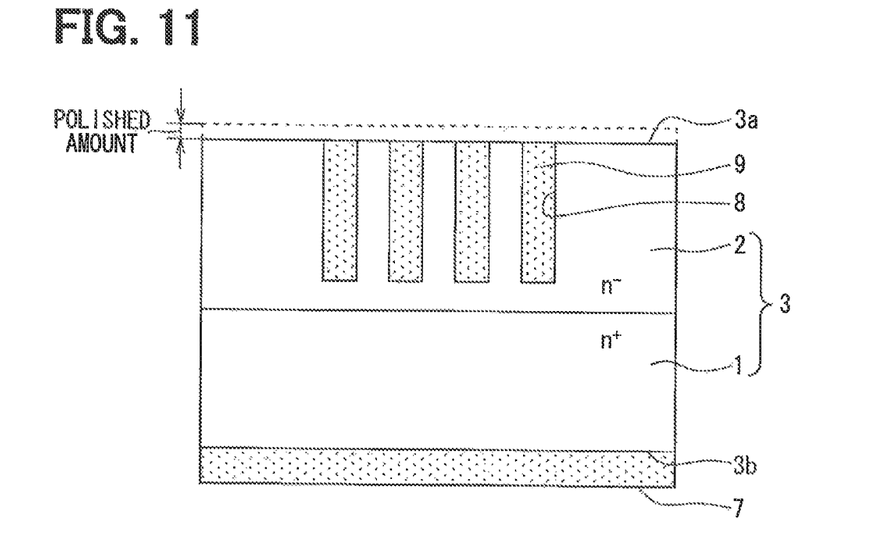
FIG. 11 is a diagram illustrating an enlarged view of FIG. 2E and showing a polished amount of a front surface of the semiconductor substrate.

As shown in FIG. 11, the polished amount is an amount of the front surface 3a polished away in the seventh manufacturing process shown in FIGS. 2E and 2F. As shown in FIG. 9, when the oxide layer 6 is not used as the polishing stopper, the variation is $-3.14 \pm 5.27$ μm. In contrast, as shown in FIG. 8, when the oxide layer 6 is used as the polishing stopper, the variation is reduced to $-0.95 \pm 1.18$ μm.

According to the first embodiment, the oxide layer 6 formed on the front surface 3a of the semiconductor substrate 3 is used not only as the mask for forming the trench 8 but also as the polishing stopper for the planarization. In such an approach, a manufacturing process where only the polishing stopper is formed is unnecessary.

Further, in the third manufacturing process shown in FIGS. 1E and 1F, the oxide layer 6 located near the opening of the trench 8 is removed by the hydrogen annealing which is originally used to remove an natural oxide layer formed in the trench 8. Therefore, an additional manufacturing process for removing the oxide layer 6 is unnecessary.

Further, the oxide layer 6 located near the opening of the trench 8 is removed in such a manner that the second portion 6b can be left not only on the outer edge of the chip region 5 but also on the scribe line 4. In such an approach, the total area of the second portion 6b serving as the polishing stopper is increased so that the inclination of the polished surface with respect to the front surface 3a of the semiconductor substrate 3 can be surely reduced or prevented.

Second Embodiment

Figure 12:
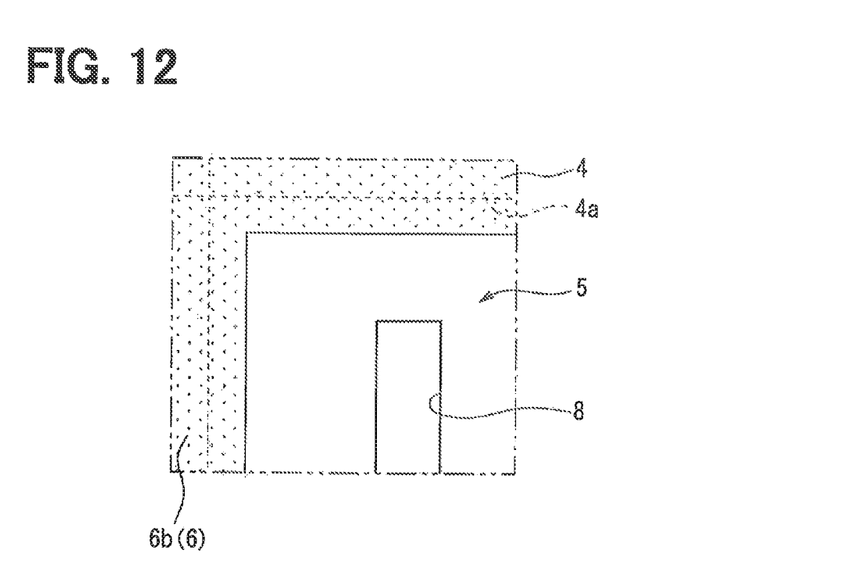
FIG. 12 is a diagram illustrating a process of manufacturing a semiconductor device according to a second embodiment of the present invention.

A second embodiment of the present disclosure is described below with reference to FIG. 12. FIG. 12 is a diagram illustrating an enlarged top view of a semiconductor device according to the second embodiment. Specifically, FIG. 12 corresponds to FIG. 1F and shows a third manufacturing process of the semiconductor device according to the second embodiment. A difference between the first embodiment and the third embodiment is as follows.

As mentioned previously, according to the first embodiment, the hydrogen annealing is performed in the third manufacturing process in such a manner that the second portion 6b can be left not only on the outer edge of the chip region 5 but also on the scribe line 4. In contrast, according to the second embodiment, the hydrogen annealing is performed in the third manufacturing process in such a manner that the second portion 6b is left on only the scribe line 4. In other words, according to the second embodiment, the second portion 6b on the chip region 5 is entirely removed by the hydrogen annealing performed in the third manufacturing process.

As described above, according to the second embodiment, the second portion 6b is left on only the scribe line 4. Even in such a case, the second portion 6b can be used as the polishing stopper for stopping the planarization of the front surface 3a side of the semiconductor substrate 3. Thus, the second embodiment can achieve the same or similar effect as the first embodiment.

Third Embodiment

A third embodiment of the present disclosure is described below with reference to FIGS. 13A-13H. FIGS. 13A-13H are diagrams illustrating manufacturing processes of a semiconductor device according to the third embodiment. Specifically, FIGS. 13A, 13C, 13E, and 13G are cross sectional views of the semiconductor device in first to fourth manufacturing processes, respectively. FIGS. 13B, 13D, 13F, and 13H are top views of the semiconductor device in the first to the fourth manufacturing processes, respectively. It is noted that a photoresist in each top view is hatched for easy understanding. A difference between the first embodiment and the third embodiment is a process of removing the oxide layer 6.

Figure 13A:
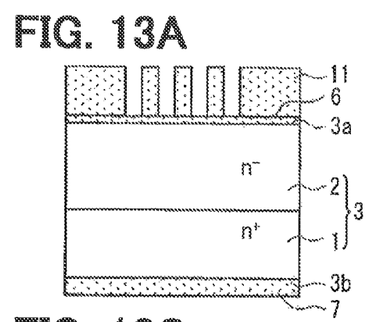
FIGS. 13A-13H are diagrams illustrating processes of manufacturing a semiconductor device according to a third embodiment of the present disclosure.
Figure 13B:
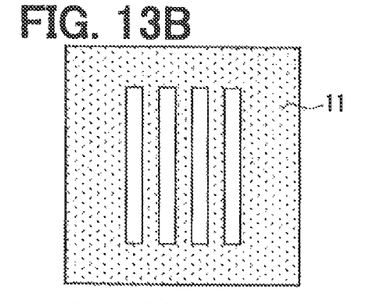

In the first manufacturing process shown in FIGS. 13A and 13B, the oxide layer 6 is formed on the front surface 3a of the semiconductor substrate 3. Then, a photoresist 11 is formed on the oxide layer 6. Then, patterning of the photoresist 11 is performed so that the photoresist 11 can have openings at trench regions, where the trenches 8 are formed. A nitride layer instead of the oxide layer 6 can be used as an electrically insulating layer.

Figure 13C:
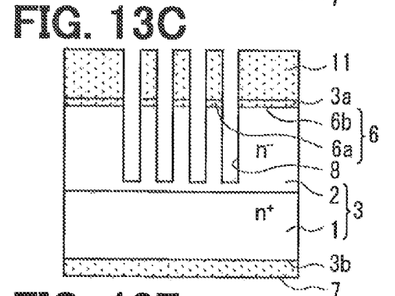
Figure 13D:
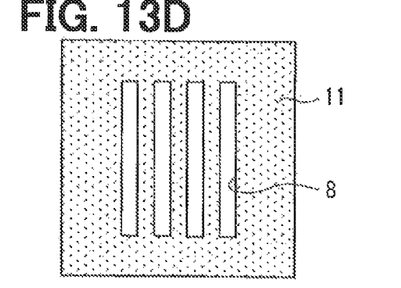

Next, in the second manufacturing process shown in FIGS. 13C and 13D, anisotropic etching of the semiconductor layer 2 and the oxide layer 6 is performed by using the photoresist 11 as an etching mask. As a result of the anisotropic etching, the trenches 8 are formed in the semiconductor layer 2. The trenches 8 extend in a predetermined direction and are arranged in a stripe pattern.

Figure 13E:
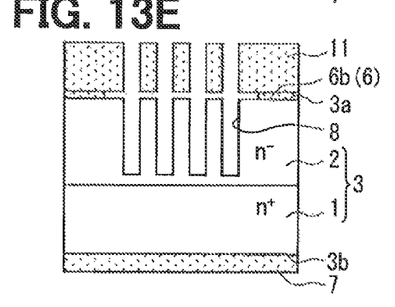
Figure 13F:
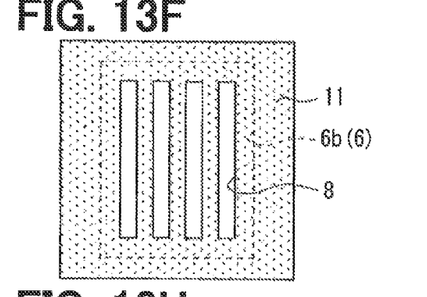

Next, in the third manufacturing process shown in FIGS. 13E and 13F, the oxide layer 6 located near the opening of the trench 8 is removed by performing isotropic etching using the photoresist 11 as an etching mask. For example, the isotropic etching can be an isotropic wet etching or an isotropic dry etching using fluorine gas or the like. Specifically, the first portion 6a is entirely removed, and the second portion 6b is partially removed so that the second portion 6b can be left on not only the outer edge of the chip region 5 but also on the scribe line 4. In other words, the second portion 6b around each opening of the trench 8 is removed so that the openings of the trenches 8 can be spaced from and collectively surrounded by the second portion 6b.

Figure 13G:
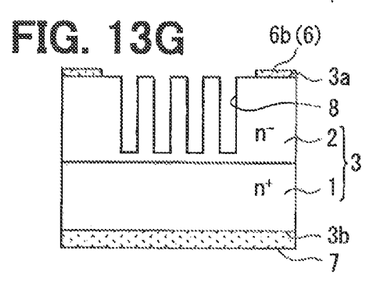
Figure 13H:
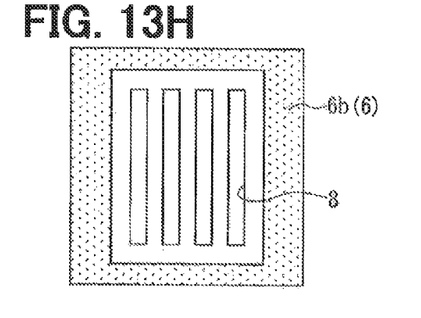

Next, in the fourth manufacturing process shown in FIGS. 13G and 13H, the photoresist 11 is removed. Thus, the same structure as shown in FIGS. 1E and 1F of the first embodiment can be formed. After the fourth manufacturing process shown in FIGS. 13G and 13H is completed, the manufacturing processes shown in FIGS. 1G and 1H and FIGS. 2A-2H are performed. Thus, the semiconductor device having a super-junction structure can be manufactured.

As described above, according to the third embodiment, the oxide layer 6 is removed by an isotropic etching in such a manner that the second portion 6b can be left not only on the outer edge of the chip region 5 but also on the scribe line 4. Thus, the third embodiment can achieve the same or similar effect as the first embodiment.

Fourth Embodiment

Figure 14A:
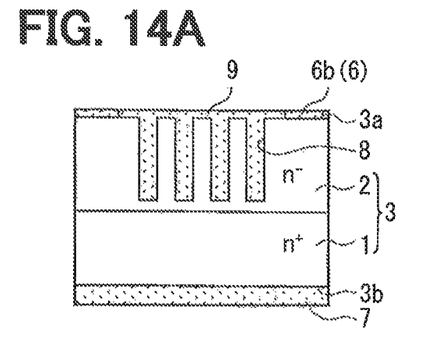
FIGS. 14A-14F are diagrams illustrating processes of manufacturing a semiconductor device according to a fourth embodiment of the present disclosure.
Figure 14B:
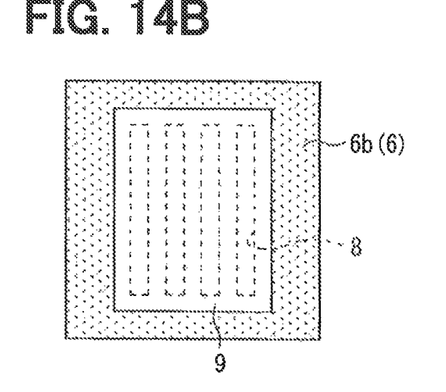
Figure 14C:
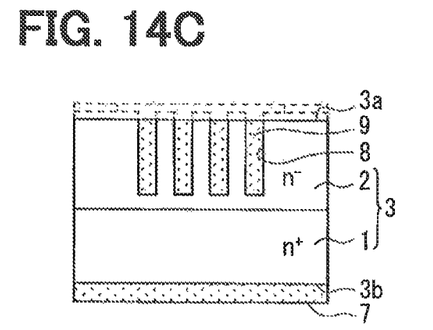
Figure 14D:
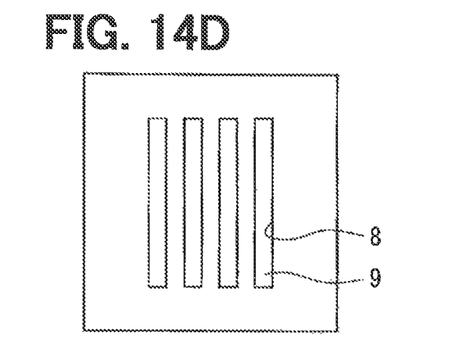
Figure 14E:
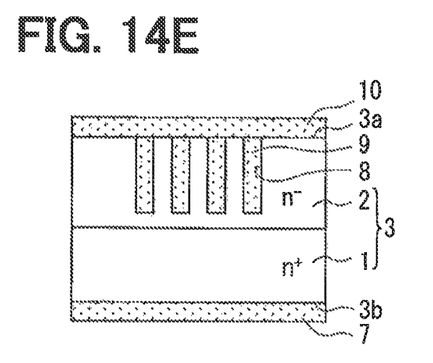
Figure 14F:
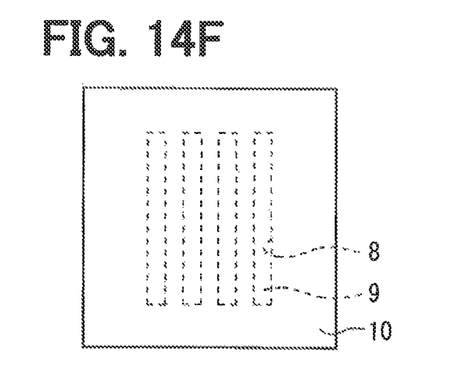

A fourth embodiment of the present disclosure is described below with reference to FIGS. 14A-14F. FIGS. 14A-14F are diagrams illustrating manufacturing processes of a semiconductor device according to the fourth embodiment. Specifically, FIGS. 14A, 14C, and 14E are cross sectional views of the semiconductor device in fifth to seventh manufacturing processes, respectively. FIGS. 14B, 14D, and 14F are top views of the semiconductor device in the fifth to the seventh manufacturing processes, respectively. It is noted that the oxide layer 6 (i.e., second portion 6b) in each top view is hatched for easy understanding. A difference between the first embodiment and the fourth embodiment is as follows.

According to the fourth embodiment, the first to the fourth manufacturing processes shown in FIGS. 1A-1H are performed. Then, in the fifth manufacturing process shown in FIGS. 14A and 14B, the front surface 3a side of the semiconductor substrate 3 is planarized with a first polishing solution by using the second portion 6b as the polishing stopper for stopping the planarization of the front surface 3a side. The fifth manufacturing process shown in FIGS. 14A and 14B are the same as the fifth manufacturing process shown in FIGS. 2A and 2B of the first embodiment. The fifth manufacturing process shown in FIGS. 14A and 14B is hereinafter referred to as the "first planarization process".

Next, in the sixth manufacturing process shown in FIGS. 14C and 14D, the second portion 6b and the epitaxial layer 9 left on the front surface 3a of the semiconductor substrate 3 are simultaneously polished with a second polishing solution until a predetermined thickness (e.g., about 1 μm to 2 μm) of the front surface 3a is polished away. The sixth manufacturing process shown in FIGS. 14C and 14D is hereinafter referred to as the "second planarization process".

Specifically, after the first planarization process is finished, a rinse process is performed to remove the first polishing solution by using pure water. Then, the second planarization process is performed by using the second polishing solution. It is noted that the polishing selectivity of the second polishing solution is less than that of the polishing selectivity of the first polishing solution. For example, the polishing selectivity of the second polishing solution can range from about 0.5 to about 5. For example, the second polishing solution can be P-silica. By using the second polishing solution having such a polishing selectivity, the second portion 6b and the epitaxial layer 9 left on the front surface 3a of the semiconductor substrate 3 can be are simultaneously polished.

Next, in the seventh manufacturing process shown in FIGS. 14E and 14F, the p-type epitaxial layer 10 is formed on the front surface 3a of the semiconductor substrate 3. Although not shown in the drawings, standard semiconductor manufacturing processes are performed subsequent to the seventh manufacturing process. Then, the semiconductor substrate 3 is divided along the scribe line 4 into chips (i.e., semiconductor devices). Thus, the semiconductor device with the super junction structure can be manufactured.

As described above, according to the second embodiment, the second portion 6b and the epitaxial layer 9 left on the front surface 3a of the semiconductor substrate 3 are simultaneously polished until a predetermined thickness of the front surface 3a is polished away. In such an approach, a manufacturing process where only the second portion 6b is removed is unnecessary.

Modifications

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

For example, the bottom of the trench 8 can be located in the $n^+$-type substrate 1.

The present disclosure can be applied to a method of manufacturing a semiconductor device other than a semiconductor device having with a super junction structure. For example, the present disclosure can be applied to a method of manufacturing a MEMS sensor for detecting pressure or the like.

The annealing performed under a non-reducing atmosphere is not limited to the hydrogen annealing. For example, nitrogen annealing can replace the hydrogen annealing.

What is claimed is:

1. A method of manufacturing a semiconductor device, the method comprising:
   preparing a semiconductor substrate having a front surface;
   forming an electrically insulating layer on the front surface;
   forming a plurality of trenches in the semiconductor substrate by using the insulating layer as a mask so that a first portion of the insulating layer is located on the front surface between adjacent trenches and that a second portion of the insulating layer is located on the front surface at a position other than between adjacent trenches;
   removing the insulating layer by entirely removing the first portion and by partially removing the second portion in such a manner that the second portion around an opening of each of the plurality of trenches is removed;
   filling the plurality of trenches with an epitaxial layer by epitaxially growing the epitaxial layer over the front surface side, and
   planarizing the front surface side by polishing the epitaxial layer using the second portion as a polishing stopper, wherein
   the forming the insulating layer includes forming an oxide layer, and
   the removing the insulating layer includes annealing the insulating layer in a non-reducing atmosphere.

2. The method according to claim 1, wherein
   the preparing the semiconductor substrate includes preparing a semiconductor wafer having a plurality of chip regions partitioned by a scribe line, and
   the removing the insulating layer includes leaving the second portion on the scribe line.

3. The method according to claim 1, wherein
   the planarizing the front surface side includes performing a first planarization process and a second planarization process,
   the performing the first planarization process includes polishing the epitaxial layer with a first polishing solution by using the second portion as the polishing stopper,
   the performing the second planarization process includes removing the second portion and the epitaxial layer on the front surface by simultaneously polishing the second portion and the epitaxial layer on the front surface with a second polishing solution until the front surface is polished away to create a new front surface,
   a polishing selectivity of the second polishing solution is less than a polishing selectivity of the first polishing solution, and
   the polishing selectivity is a ratio of a first rate, at which the semiconductor substrate is polished, to a second rate, at which the oxide layer is polished.

4. The method according to claim 1, wherein
   the preparing the semiconductor substrate includes preparing the semiconductor substrate of first conductivity type, and
   the filling the plurality of trenches includes epitaxially growing the epitaxial layer of second conductivity type so that a super junction structure is provided with the epitaxial layer in each trench and the semiconductor substrate between adjacent trenches.

5. The method according to claim 1, wherein
   the forming the insulating layer includes forming a thermal oxide layer.

* * * * *